United States Patent
Raff

(10) Patent No.: US 9,285,833 B2
(45) Date of Patent: Mar. 15, 2016

(54) TRIMLESS GLASS ENCLOSURE INTERFACE

(71) Applicant: Apple Inc., Cupertino, CA (US)

(72) Inventor: John Raff, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/668,799

(22) Filed: Mar. 25, 2015

(65) Prior Publication Data

US 2015/0198976 A1  Jul. 16, 2015

Related U.S. Application Data

(63) Continuation of application No. 13/908,970, filed on Jun. 3, 2013, now Pat. No. 9,047,044.

(60) Provisional application No. 61/715,970, filed on Oct. 19, 2012.

(51) Int. Cl.
*G06F 1/16* (2006.01)
*H05K 5/02* (2006.01)

(52) U.S. Cl.
CPC ............... *G06F 1/1637* (2013.01); *G06F 1/16* (2013.01); *G06F 1/1626* (2013.01); *H05K 5/0217* (2013.01); *Y10T 156/10* (2015.01)

(58) Field of Classification Search
CPC ............................ G06F 1/1626; G06F 1/1637
See application file for complete search history.

(56) References Cited

U.S. PATENT DOCUMENTS

| | | | |
|---|---|---|---|
| 8,592,693 B2* | 11/2013 | Dai | 174/562 |
| 2010/0315769 A1* | 12/2010 | Mathew et al. | 361/679.29 |
| 2013/0279088 A1* | 10/2013 | Raff et al. | 361/679.01 |

* cited by examiner

*Primary Examiner* — Anthony Q Edwards
(74) *Attorney, Agent, or Firm* — Downey Brand LLP

(57) ABSTRACT

An enclosure for a portable computing device can include a cover glass affixed to an enclosure without trim pieces disposed between the cover glass and the disclosure. In one embodiment, the enclosure can include an edge profile that can define a relatively large contact pad about the enclosure. The contact pad can distribute impact forces over a relatively large area and thereby protect the cover glass integrity.

20 Claims, 6 Drawing Sheets

TRIMLESS GLASS ENCLOSURE INTERFACE

CROSS-REFERENCE TO RELATED APPLICATIONS

This application is a continuation of U.S. application Ser. No. 13/908,970, filed Jun. 3, 2013, and entitled "TRIMLESS GLASS ENCLOSURE INTERFACE", which claims the benefit under 35 U.S.C. 119(e) of U.S. Provisional Patent Application No. 61/715,970, filed Oct. 19, 2012, and entitled "TRIMLESS GLASS ENCLOSURE INTERFACE", the contents of which are incorporated herein by reference in their entirety for all purposes.

FIELD

The described embodiments relate generally to enclosures for portable computing devices and more particularly to glass interfaces with enclosures for portable computing devices.

BACKGROUND

Portable computing devices such as media players or tablet computers typically include a generous display configured to show a user graphical output and oftentimes the display is combined with a touch sensitive input device that allows the user to control the portable computing device.

As portable computing devices become more compact, the enclosure design and the display must also become smaller. However, simply size reducing older designs can provide a product that may not provide adequate display area or may not adequately protect a cover glass attached to the portable computing device. Furthermore, conventional device enclosures include trim gaskets, trim pieces, or other trim-protective features which may decrease the aesthetics of a final device.

Therefore, what is desired is a portable computing device with an enclosure design that can be reduced in size, that can increase aesthetic qualities, and that will adequately protect the cover glass.

SUMMARY

This paper describes various embodiments that relate to enclosures for a portable computing device. In one embodiment, a method for attaching a cover glass to an enclosure of a portable computing device absent a trim piece disposed between the cover glass and the enclosure is disclosed. The method includes affixing a display assembly to the enclosure, applying an adhesive to the enclosure, and attaching the cover glass to the adhesive.

In another embodiment, an enclosure for a portable computing device can include a body formed from a single and continuous piece of aluminum, the body including a bottom an four side walls, where at least one side wall includes a profile including a curve and an apex where the apex is arranged to be located on a 45 degree slope below an upper corner of the body, an opening configured to receive internal components, a support ledge configured to receive an adhesive and a cover glass configured to fit within the opening and bond to the adhesive on the support ledge.

In another embodiment, a personal computing device is disclosed. The personal computing device may be a tablet computer, telephone, media player, or other computing device. The device may include a body formed from a single and continuous piece of aluminum. The body may include a bottom and at least one side wall. The at least one side wall includes a profile including a curve and an apex arranged to be located on a slope below an upper corner of the body. The body may further include a cavity configured to receive internal components, a support ledge configured to receive an adhesive, and a cover glass configured to fit within the opening and bond to the adhesive on the support ledge.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Figure 1:
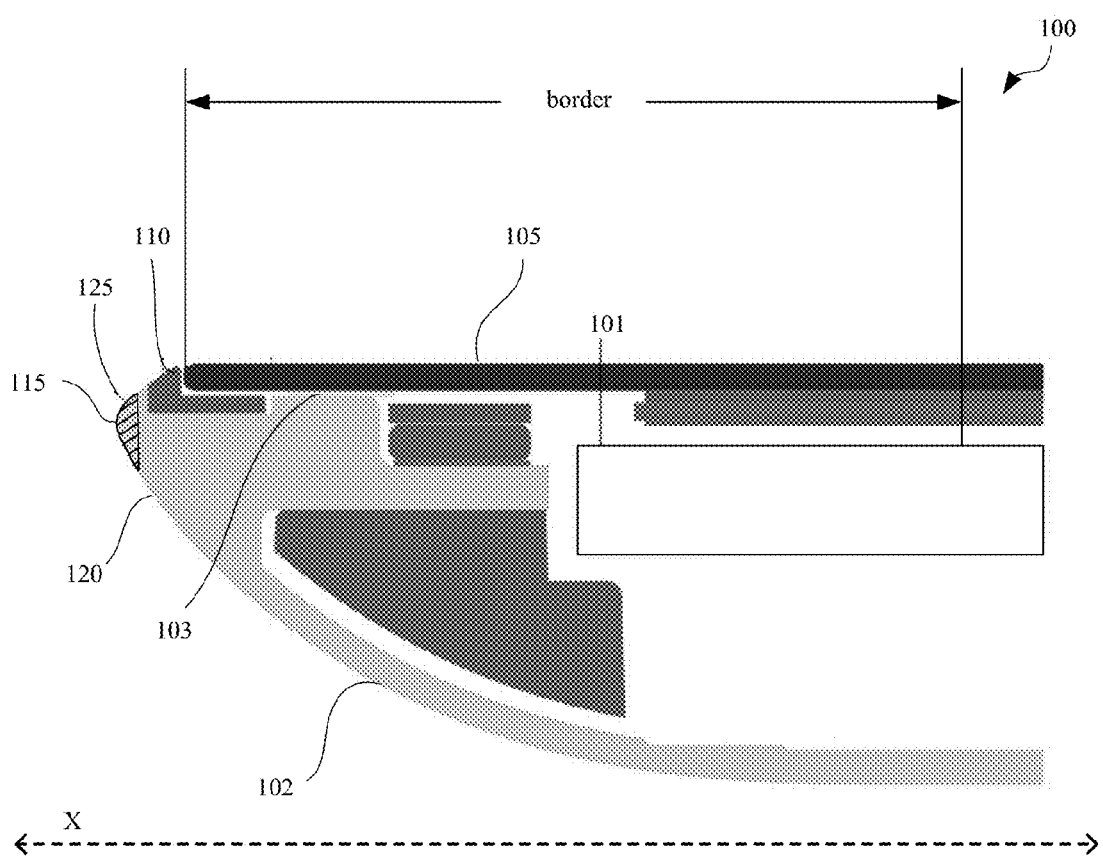
FIG. 1 (Prior Art) is a cross sectional view of a conventional portable computing device.

FIG. 1 is a cross sectional view of a conventional portable computing device 100. The portable computing device 100 can include an enclosure 102. The enclosure can form a cavity that can enclose various functional components for the portable computing device such as a battery, a processor, memory, wireless interfaces etc. The portable computing device 100 can include a display assembly 101 that can include a liquid crystal display, filters and a light source. The portable computing device 100 can include a cover glass 105 that can be attached to the enclosure 102 with an adhesive 103. Disposed between cover glass 105 and enclosure 102 is a trim piece 110. The trim piece 110 can absorb some shock that can be transmitted from enclosure 102 to cover glass 105 when portable computing device 100 is exposed to an impact along the X-axis as shown. Additionally trim piece 110 can be used to mask any tolerance build up problems that can be present in the design of portable computing device 100, particularly in the area of the interface between the cover glass 105 and the enclosure 102.

An impact along the X-axis can occur when portable computing device falls and lands on or near apex 115. The edge profile 120 near apex 115 can define a narrow contact pad 125 (shown with cross hatched lines). A consequence of the narrow contact pad 125 is that forces subjected to the region of the narrow contact pad 125 are concentrated and can deliver a relatively sharper shock or impact in the region near narrow contact pad 125, such as near cover glass 105. In some cases, a blow or impact to the narrow contact pad 125 can cause damage to cover glass 105, even with trim piece 110 available to absorb a portion of the impact forces.

Figure 2:
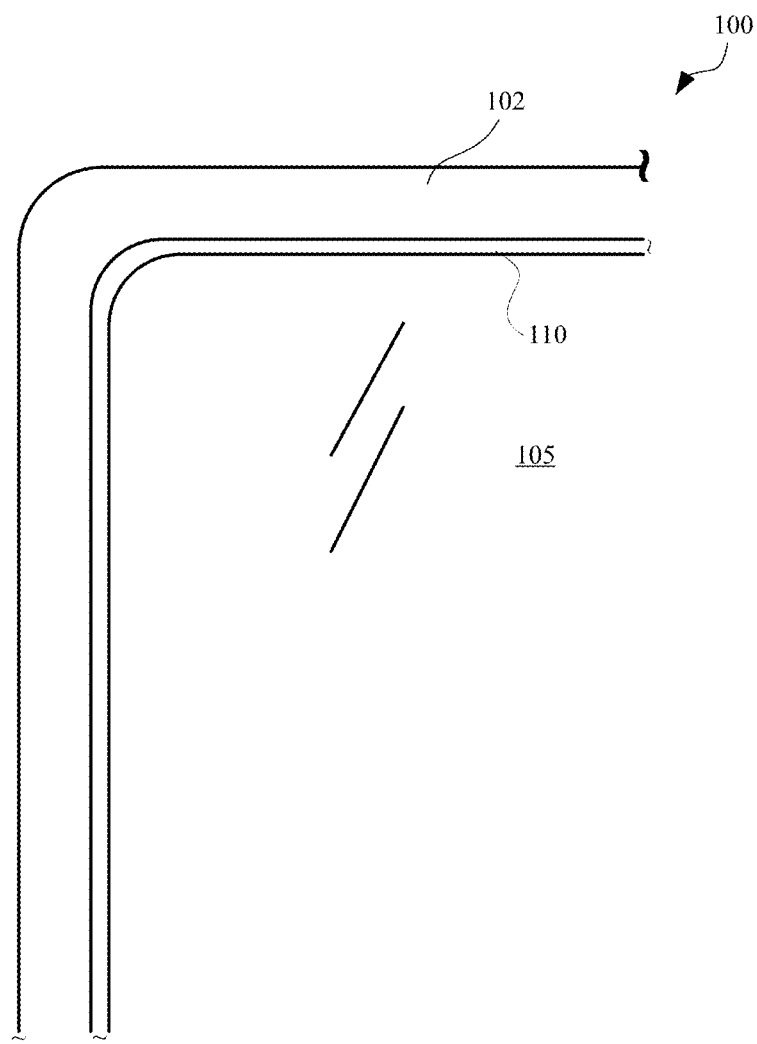
FIG. 2 (Prior Art) is a planar view of a portion of the computing device of FIG. 1.

FIG. 2 is a planar view of a portion of the computing device 100. As shown, the computing device 100, when viewed from above the cover glass 105, includes a clear view of the trim piece 110. The trim piece 110 extends about the cover glass 105, and therefore is seen while a user is manipulating or using computing device 100. As such, the trim piece 110 may detract from the overall aesthetic quality of computing device 100.

However, exemplary embodiments of the present invention provide methods and apparatuses which overcome these and other drawbacks, as described below.

Figure 3:
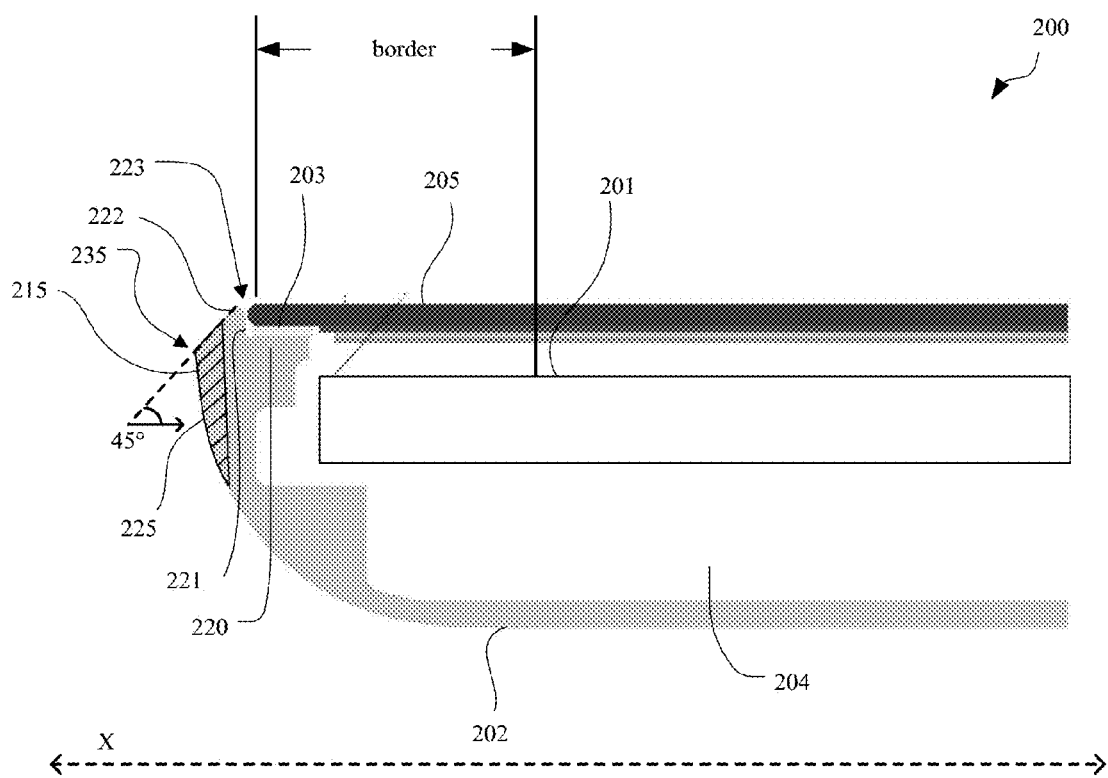
FIG. 3 is a cross sectional view of a portable computing device in accordance with an exemplary embodiment of the invention.

FIG. 3 is a cross sectional view of a portable computing device 200 in accordance with an exemplary embodiment of the invention. Portable computing device 200 can include an enclosure 202. The enclosure 202 can be formed from a resilient and sturdy material. In one embodiment, enclosure 202 can be formed from aluminum. Enclosure 202 can be shaped to form a cavity 204 to enclose and protect various components that can be included with the portable computing device 200 such as a processor, memory, wireless interfaces, battery, etc. Portable computing device can also include a display assembly 201 that can include a LCD display and a backlight. In one embodiment, the display assembly 201 can be configured to include a relatively smaller border area than conventional display assemblies. Smaller border areas can enable an active screen area to be affected to a lesser extent even when an overall size of the portable computing device 200 can be smaller than portable computing device 100.

Adhesive 203 can be disposed on a support 220 formed within enclosure 202. In one embodiment adhesive 203 can bond a cover glass 205 to enclosure 202. The cover glass 205 can be bonded directly to enclosure 202 without any extra layers between cover glass 205 and enclosure 202 (such as trim piece 110 shown above). In one embodiment machining operations for the enclosure 202, especially operations for forming support 220 and side wall 221 can be formed at relatively the same time thereby allowing relatively good control of tolerances associated with the opening configured to receive cover glass 205. Machining operations for cover glass 205 can also be well controlled enabling the cover glass 205 to fit relatively well with a highly controlled gap 223 between enclosure 202 and cover glass 205.

Enclosure 202 can include a gentle sweeping edge profile 225. The edge profile 225 can form a broad contact pad 215. The contact pad 215 can spread any impact forces received in this edge area over a relatively greater area than contact pad 125. This larger area can absorb and distribute impact forces through more of enclosure 202. The gentle sweeping edge profile 225 also provides a less prominent apex 235 in the edge area. The less prominent apex 235 can also help distribute impact forces received in the edge area. In one embodiment, apex 235 can be positioned on a 45 degree line emanating from top corner 222 of enclosure 202. In another embodiment, the apex 235 can be positioned on a line at a differing angle than that illustrated, according to any desired structural or aesthetic characteristics of a finished product.

According to one embodiment, device 200 weighs approximately 0.7 lbs. According to another embodiment, device 200 weighs less than about 0.7 lbs. According to yet another embodiment, the device 200 weighs less than about 1.4 lbs. Accordingly, the relatively low weight of device 200 further enhances the applicability of the edge profile 225, allowing for the clean lined top-down view without necessitating the additional trim piece 110 of computing device 100. However, in some embodiments, a trim piece somewhat similar to trim piece 110 may be included for additional protection of cover glass 205.

According to one embodiment, the gap 223 is approximately 0.05 mm. According to another embodiment, the gap 223 is less than about 0.05 mm. According to yet another embodiment, the gap 223 is slightly larger than about 0.05 mm. Accordingly, the small size of the gap 223 allows for a desirable and clean interface between the enclosure 202 and display cover glass 205 further enhancing aesthetics of the device 200.

Figure 4:
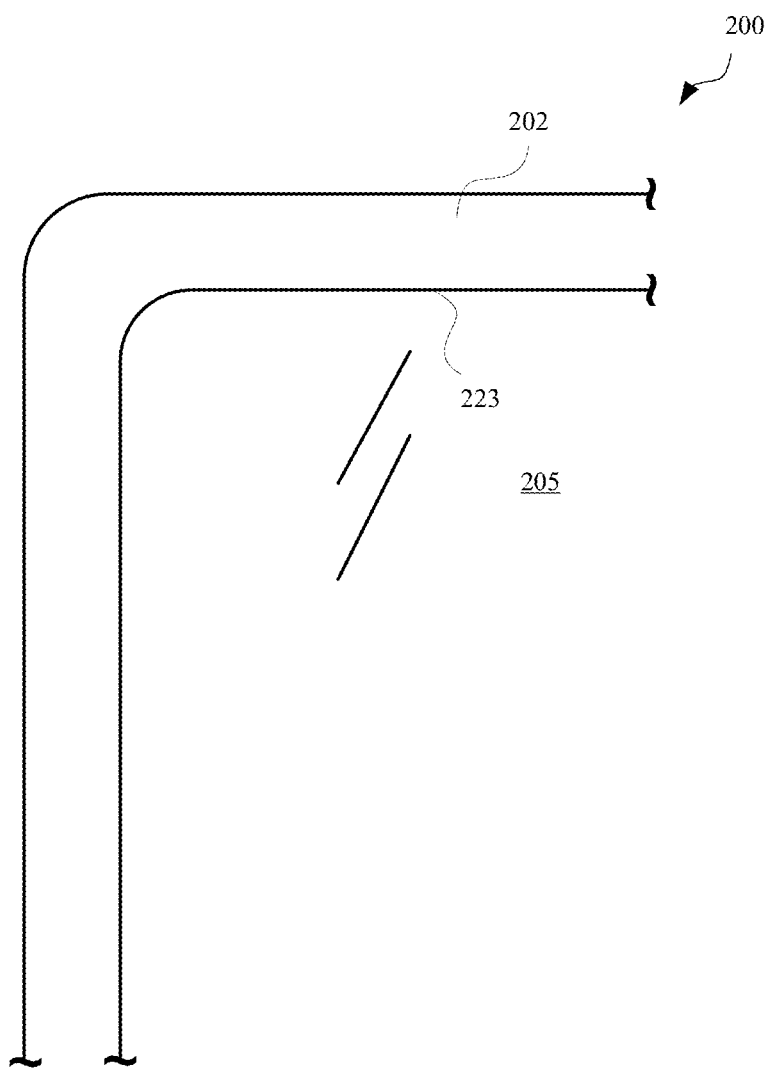
FIG. 4 is a planar view of a portion of the computing device of FIG. 3.

FIG. 4 is a planar view of a portion of the device 200. As shown, the device 200, when viewed from above the cover glass 205, includes a clean and desirable interface between cover glass 205 and enclosure 202, with only the relatively small gap 223 viewable. As such, the aesthetic quality of device 200 may be desirable.

Figure 5:
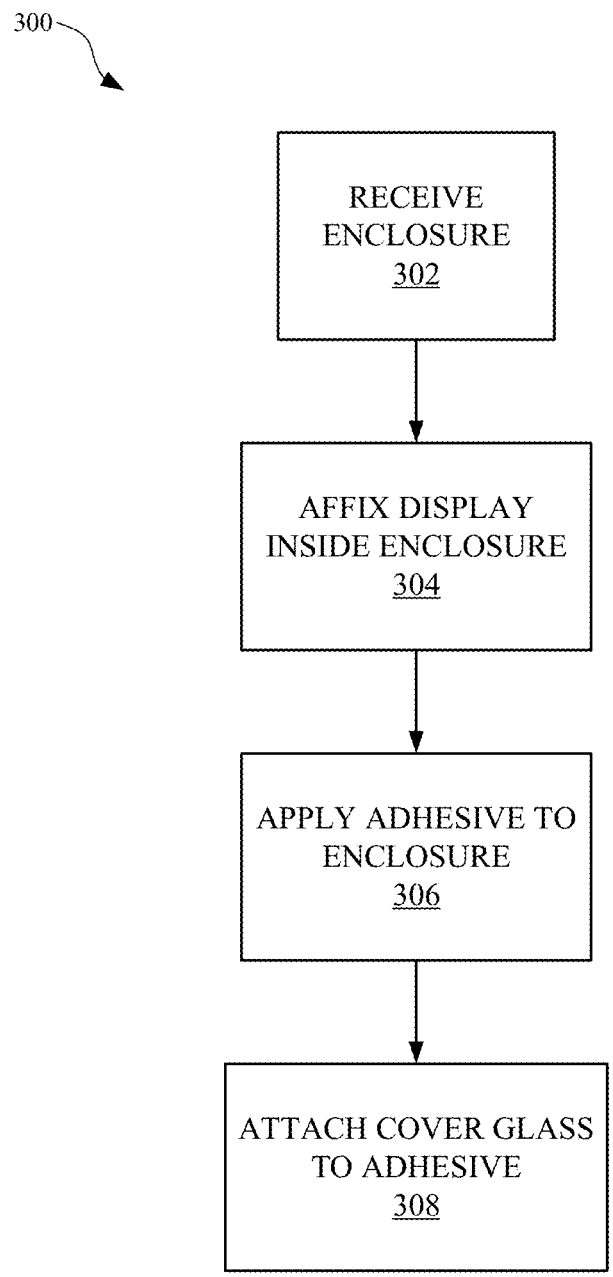
FIG. 5 is a flow chart of a method of forming a device in accordance with an exemplary embodiment of the invention.

FIG. 5 is a flow chart 300 of a method of forming a device similar to device 200, according to an exemplary embodiment of the invention. The method can begin in step 302 by receiving the enclosure 202. In step 304, a display assembly 201 can be mounted within the enclosure 202 and/or cavity 204. In step 306, adhesive 203 can be applied to the enclosure 202. In one embodiment, adhesive 203 can be applied to support 220 on enclosure 202. In another embodiment, adhesive 203 can be a pressure sensitive adhesive. In yet another embodiment, adhesive 203 can be a compliant foam with a pressure sensitive adhesive applied on two sides of the compliant foam. In step 308, the cover glass 205 can be attached to the adhesive.

As described above, the enclosure 202 may be received, a display assembly mounted, and a cover glass attached. However, the same may be varied in many ways. For example, pressure sensitive adhesive may be applied in any step preceding application of the cover glass 205. Furthermore, machining, polishing, and other steps may also be applicable.

Figure 6:
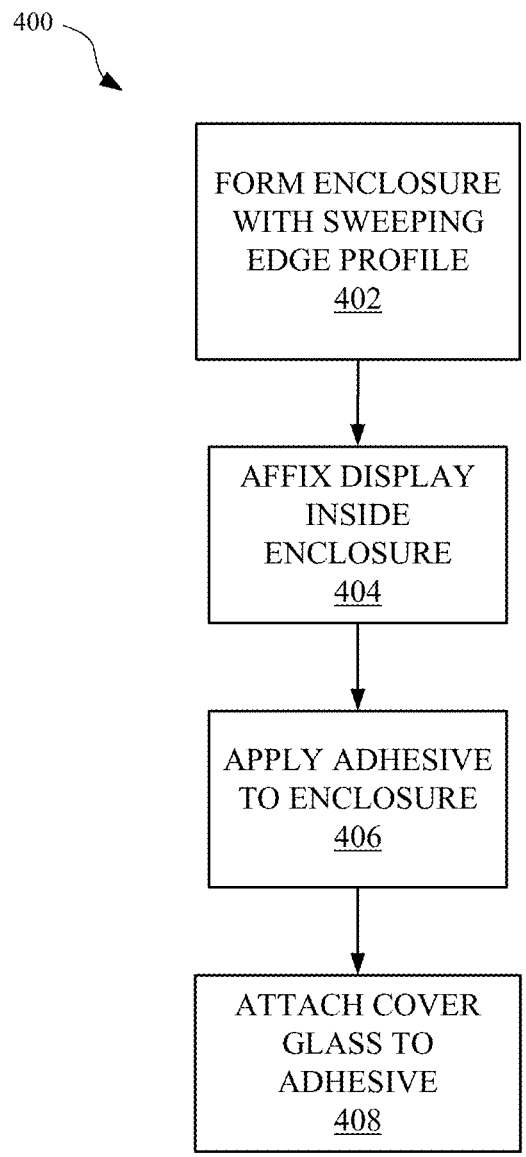
FIG. 6 is a flow chart of a method of forming a device in accordance with an exemplary embodiment of the invention.

For example, FIG. 6 is a flow chart 400 of a method of forming a device similar to device 200, according to an exemplary embodiment of the invention. The method 400 can begin in step 402 by forming the enclosure 202 with the sweeping edge profile 225 and associated sidewall 221 adjacent the support 220. The forming may include forming the enclosure 202 from a single piece of aluminum, for example, using a machining device, cutting device, or any other suitable device to form the features described herein.

In step 404, a display assembly 201 can be mounted within the enclosure 202 and/or cavity 204. In step 406, adhesive 203 can be applied to the enclosure 202. In step 408, the cover glass 205 can be attached to the adhesive.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A computing device, comprising:
   a display assembly comprising a display and a display cover overlaying the display;
   a body comprising a bottom wall and a side wall that define an internal cavity, wherein a periphery of the side wall includes an edge that defines a front side opening suitable for carrying the display assembly;
   a first support that is in proximity to the edge and extends from the side wall into the internal cavity, wherein the display cover abuts a planar surface of the first support and an outer most edge of the first support; and
   a second support between the first support and the bottom wall, wherein the second support extends further into the internal cavity than the first support.

2. The computing device as in claim 1, wherein the edge is defined in part by an interior facing surface extending from the first support.

3. The computing device of claim 2, wherein the edge defines an edge of the side wall and is adjacent to the display cover.

4. The computing device of claim 1, wherein the body further comprises an adhesive disposed over a portion of the first support.

5. The computing device of claim 1, wherein an interior surface of the display cover is coupled to the display assembly and the display assembly extends over the second support.

6. The computing device of claim 1, wherein the body further comprises curved corners, and the side wall defines a portion of each curved corner.

7. The computing device of claim 6, wherein the side wall is curved and defines an outer edge of the body.

8. The computing device of claim 1, wherein the display is a liquid crystal display that includes a backlight.

9. A mobile device, comprising:
   a body, comprising:
     a first support configured to support a display cover, wherein the display cover abuts a planar surface of the first support and an outer most edge of the first support;
     a second support between the first support and a bottom surface of the body; and
     a side wall comprising a curved exterior surface and an interior surface, wherein the second support extends directly from the interior surface into a cavity of the body further than the first support extends from the interior surface.

10. The mobile device of claim 9, wherein a periphery of the body includes an edge that is adjacent to the display cover.

11. The mobile device of claim 9, wherein the body further comprises an adhesive disposed over a portion of the first support.

12. The mobile device of claim 9, wherein the body further comprises curved corners and the curved exterior surface defines a portion of each curved corner.

13. The mobile device of claim 9, wherein the curved exterior surface exclusively defines an outer edge of the body.

14. The mobile device of claim 9, wherein the display cover is connected to a liquid crystal display that includes a backlight.

15. A housing for a computer, the housing comprising:
   a first support and a second support, each extending directly from different portions of an inner surface of the housing into a cavity of the housing, wherein a planar surface of the first support and an outer most edge of the first support are configured to support and abut a display cover of the computer; and
   a side wall having a periphery comprising a curved exterior surface and an edge that is defined in part by an interior wall extending from the first support of the housing.

16. The housing of claim 15, wherein the second support extends further into the cavity than the first support.

17. The housing of claim 15, wherein the second support is more proximate to a bottom surface of the housing than the first support.

18. The housing of claim 15, wherein the housing further comprises curved exterior corners and the curved exterior surface extends over each curved exterior corner.

19. The housing of claim 15, wherein the curved exterior surface defines an outermost edge of the housing.

20. The housing of claim 15, wherein the curved exterior surface extends from a planar bottom surface of the housing.

* * * * *